United States Patent [19]
Krautschneider et al.

[11] Patent Number: 5,920,099
[45] Date of Patent: Jul. 6, 1999

[54] READ-ONLY MEMORY CELL ARRAY AND PROCESS FOR MANUFACTURING IT

[75] Inventors: Wolfgang Krautschneider, Hohenthann; Lothar Risch, Neubiberg; Franz Hofmann, München, all of Germany

[73] Assignee: Siemens Aktiengesellschaft, Munich, Germany

[21] Appl. No.: 08/913,332

[22] PCT Filed: Mar. 4, 1996

[86] PCT No.: PCT/DE96/00380

§ 371 Date: Sep. 11, 1997

§ 102(e) Date: Sep. 11, 1997

[87] PCT Pub. No.: WO96/29739

PCT Pub. Date: Sep. 26, 1996

[30] Foreign Application Priority Data

Mar. 20, 1995 [DE] Germany .......................... 195 10 042

[51] Int. Cl.⁶ .................................................. H01L 27/112
[52] U.S. Cl. ........................................................... 257/390
[58] Field of Search ............................................. 257/390

[56] References Cited

U.S. PATENT DOCUMENTS 5,306,941 4/1994 Yoshida .................................... 257/390

OTHER PUBLICATIONS

Patent Abstract of Japan, (E–1299, Dec. 18, 1992, vol. 16, No. 579) JP 4–226071 (A), Aug. 14, 1992, Semiconductor Memory Device, (Patent attached, pp. 701–708).

Patent Abstract of Japan, (E–1421, Aug. 25, 1993, vol. 17,, No. 466) JP 5–110036 (A), Apr. 30, 1993, Semiconductor Memory and Manufacture Thereof, (Patent attached, pp. 223–227).

IEEE Journal of Solid–State Circuits, vol. SC–11, No. 3, Jun. 1976, Minimum Size ROM Structure Compatible with Silicon–Gate E/D MOS LSI, H. Kawagoe et al, pp. 360–364.

*Primary Examiner*—David B. Hardy
*Attorney, Agent, or Firm*—Hill & Simpson

[57] ABSTRACT

A read-only memory cell array has a plurality of individual memory cells which each have a MOS transistor and which are arranged in rows running in parallel. In this context, adjacent rows run alternately at the bottom of the longitudinal trenches (6) and between adjacent longitudinal trenches (6) respectively and are insulated with respect to one another. The read-only memory cell array can be manufactured by self-aligning process steps with an area of 2 $F^2$ (F: minimum structure size) being required per memory cell.

12 Claims, 3 Drawing Sheets

READ-ONLY MEMORY CELL ARRAY AND PROCESS FOR MANUFACTURING IT

BACKGROUND OF THE INVENTION

Memories into which data are permanently written are required for many electronic systems. Such memories are referred to, inter alia, as read-only memories.

For very large quantities of data plastic discs coated with aluminum are often used as read-only memories. In the coating these plastic discs have two kinds of dot-like depressions which are assigned to the logic values zero and one. The information is stored digitally in the arrangement of these depressions. Such discs are referred to as compact discs and are widespread for the digital storage of music.

A reading device in which the disc is mechanically rotated is used to read the data stored on a compact disc. The dot-like depressions are scanned by means of a laser diode and a photo cell. Typical scanning rates in this context are 2×40 kHz. Five Gbits of information can be stored on a compact disc.

The reading device has moving parts which are subject to mechanical wear, require a comparatively large volume and only permit slow data access. Moreover, the reading device is sensitive to jolts and can therefore only be used to a limited degree in mobile systems.

Read-only memories on a semiconductor basis are known for the storage of relatively small quantities of data. Such read-only memories are often realized as a planar integrated silicon circuit in which MOS transistors are used. The MOS transistors are respectively selected via the gate electrode which is connected to the word line. The input of the MOS transistor is connected to a reference line and the output to a bit line. During the reading process it is evaluated whether a current is flowing through the transistor or not. The stored information is assigned correspondingly. The storage of information is usually brought about technically in that the MOS transistors have different threshold voltages as a result of different implantations in the channel region.

These memories on a semiconductor basis permit random access to the stored information. The electric power which is necessary for reading the information is considerably smaller than in a reading device with a mechanical drive. Since no mechanical drive is necessary to read the information, the mechanical wear and the sensitivity to jolts are eliminated. Read-only memories on a semiconductor basis can therefore also be used for mobile systems.

The silicon memories described have a planar structure. Thus, a minimum area of approximately 6 to 8 $F^2$ is required per memory cell, F being the smallest size of structure which can be manufactured with the respective technology. With 1 $\mu$m technology, planar silicon memories are therefore limited to storage densities of approximately 0.14 bits per $\mu m^2$.

It is known to increase the storage density in planar silicon memories by arranging the MOS transistors in rows. In each row the MOS transistors are connected in series. The MOS transistors are read out by driving on a row-by-row basis in the manner of an "NAND" architecture. For this only two connections are required per row, between which connections the MOS transistors which are arranged in the row are connected in series. Source/drain regions, which are connected to one another, of adjacent MOS transistors can then be realized as a continuous doped region. As a result, the area required per memory cell can be reduced to theoretically 4 $F^2$ (F: the smallest size of structure which can be manufactured with the respective technology). Such a memory cell array is known for example from H. Kawagoe and N. Tsuji in IEEE J. Solid-State Circuits, vol. SC-11, p. 360, 1976.

SUMMARY OF THE INVENTION

The invention is based on the problem of disclosing a read-only memory cell array on a semiconductor basis in which an increased storage density is achieved and which can be manufactured with few manufacturing steps and a high yield. Furthermore, a process for manufacturing such a memory cell array is to be disclosed.

In general terms the present invention is a read-only memory cell array. A plurality of individual memory cells are provided in a semiconductor substrate. The memory cells are each arranged in rows running essentially parallel. Longitudinal trenches, which run essentially parallel to the rows, are provided in a main surface of the semiconductor substrate. The rows are arranged alternately on the main surface between adjacent longitudinal trenches and at the bottom of the longitudinal trenches, respectively. Insulation structures are provided which insulate adjacent rows with respect to one another. The memory cells each have at least one MOS transistor. Word lines, which are connected in each case to the gate electrodes of MOS transistors which are arranged along different rows, run transversely with respect to the rows.

Advantageous developments of the present invention are as follows.

For the insulation of adjacent rows, the insulation structures have insulating spacers which are arranged along the sidewalls of the longitudinal trenches and doped layers which are arranged in each case between adjacent longitudinal trenches in the semiconductor substrate and prevent the formation of conductive channels in the semiconductor substrate between adjacent rows.

The MOS transistors of memory cells arranged along one row are connected in series. Source/drain regions, connected to one another, of MOS transistors which are adjacent along one row are constructed as a continuous doped region in the semiconductor substrate. Each row has two connections, between which connections the MOS transistors which are arranged in the row are connected in series.

The MOS transistors have different threshold voltages depending on the information stored in the respective memory cell. The present invention is also a process for manufacturing a read-only memory cell array. Longitudinal trenches which run essentially parallel are etched in one main surface of a semiconductor substrate. A plurality of memory cells which are arranged in rows and which each have at least one MOS transistor are produced. The rows are arranged alternately on the main surface between adjacent longitudinal trenches and at the bottom of the longitudinal trenches. Before the etching of the longitudinal trenches, a first channel implantation is made in order to set the threshold voltages of the MOS transistors which are arranged on the main surface between adjacent longitudinal trenches. After the etching of the longitudinal trenches, a second channel implantation is made in order to set the threshold voltages of the MOS transistors which are arranged at the bottom of the longitudinal trenches. The main surface between adjacent longitudinal trenches is masked. A gate oxide layer is produced. Word lines which run transversely with respect to the rows are produced, which word lines are connected in each case to gate electrodes of MOS transistors which are arranged along different rows. A source/drain implantation for the MOS transistors is made, during which the word lines are used as a mask. Insulation structures are produced which insulate the MOS transistors of adjacent rows with respect to one another.

Advantageous developments of the present invention are as follows.

In order to form the insulation structures, a doped layer is produced in the semiconductor substrate before the first channel implantation. The doped layer is etched through during the etching of the longitudinal trenches and prevents the formation of conductive channels in the semiconductor substrate between adjacent rows. In order to form the insulation structures, insulating spacers are also produced on the sidewalls of the longitudinal trenches after the etching of the longitudinal trenches.

The etching of the longitudinal trenches takes place using a trench mask containing $SiO_2$ as etching mask. During the second channel implantation, the trench mask which contains $SiO_2$ masks the main surface between adjacent longitudinal trenches. The trench mask is removed after the channel implantation.

In the read-only memory cell array according to the invention, memory cells are arranged in a main surface of a semiconductor substrate in each case in rows running essentially parallel. Longitudinal trenches are provided in the main surface of the semiconductor substrate. The longitudinal trenches run essentially parallel to the rows. They are at least as long as the rows. The rows are arranged alternately between adjacent longitudinal trenches and at the bottom of the longitudinal trenches respectively. The main surface of the semiconductor substrate is structured by means of the longitudinal trenches. Every second row is arranged at the bottom of the longitudinal trenches and the rows arranged between them are arranged on the material bounding the longitudinal trenches.

Adjacent rows are insulated with respect to one another by means of an insulation structure. The insulation structure insulates adjacent rows in the vertical direction. It is part of the scope of the invention to construct the insulation structure by means of insulating spacers which are arranged along the sidewalls of the longitudinal trenches and doped layers which are arranged in each case between adjacent longitudinal trenches in the semiconductor substrate and prevent the formation of conductive channels in the semiconductor substrate between adjacent rows, these being so-called channel-stop layers. The doped layers are preferably constructed in the material of the semiconductor substrate which is arranged in each case between adjacent longitudinal trenches, and the said doped layers have a depth in the semiconductor substrate which is less than the depth of the longitudinal trenches. This insulation does not require any surface between adjacent rows. Adjacent rows are directly adjacent to one another parallel to the main surface of the semiconductor substrate. Perpendicular to the main surface of the semiconductor substrate, adjacent rows are spaced in a way corresponding to the depth of the longitudinal trenches.

The MOS transistors of memory cells arranged along one row are preferably connected in series. Source/drain regions, connected to one another, of MOS transistors which are adjacent along one row are constructed here as a continuous doped region. Each row has two connections between which MOS transistors which are arranged in the row are connected in series. The MOS transistors which are located in the respective rows can be driven by means of these connections in the manner of an "NAND" architecture.

Preferably, the read-only memory cell array according to the invention is realized with an insulation structure which comprises insulating spacers and doped layers which prevent the formation of conductive channels in the semiconductor substrate between adjacent rows, as well as with MOS transistors which are connected in series in each row and in which source/drain regions which are connected to one another are constructed in each case as a continuous doped region in the semiconductor substrate. If the width of the longitudinal trenches, the space between adjacent longitudinal trenches, the extent of the continuous doped regions and the width of the word lines are constructed in this embodiment in accordance with the minimum structure size F which can be produced with the respective technology, the area required per memory cell is $2\,F^2$. Taking as a basis a technology with a minimum structure width F of 0.4 $\mu$m, a storage density of 6.25 bit/$\mu m^2$ can thus be achieved.

It is within the scope of the invention that the MOS transistors have different threshold voltages depending on the information stored in the respective memory cell. In order to store the data in digital form, the MOS transistors have two different threshold voltages. If the read-only memory cell array is to be used for multivalue logic, the MOS transistors have more than two different threshold voltages depending on the information stored.

The manufacture of the read-only memory cell array according to the invention is carried out using self-aligning process steps so that the space required per memory cell can be reduced.

In order to manufacture the read-only memory cell array, a first channel implantation is made initially in order to set the threshold voltages of the MOS transistors which are arranged along rows which are arranged between adjacent longitudinal trenches. Subsequently, the longitudinal trenches are etched. After the etching of the longitudinal trenches a second channel implantation takes place in order to set the threshold voltages of the MOS transistors which are arranged at the bottom of the longitudinal trenches. During the second channel implantation the areas between adjacent longitudinal trenches are masked. After a gate oxide layer is produced for all the MOS transistors, word lines which run transversely with respect to the rows are produced, which word lines each form gate electrodes of MOS transistors which are arranged along different rows. Finally, a source/drain implantation is made, during which the word lines are used as a mask and at the same time the source/drain regions are formed for the MOS transistors which are arranged at the bottom of the longitudinal trenches and for the MOS transistors which are arranged between adjacent longitudinal trenches.

Preferably, the longitudinal trenches are etched using a trench mask containing $SiO_2$ as etching mask. The trench mask is subsequently used to mask the areas between adjacent longitudinal trenches during the second channel implantation. After the second channel implantation the trench mask is removed.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

In order to manufacture a read-only memory cell array according to the invention in a substrate 1 from, for example, monocrystalline silicon, an insulation structure (not illustrated) which defines the area for the read-only memory cell array is initially produced on a main surface 2 of the substrate 1. The substrate 1 is for example p-doped with a dopant concentration of $10^{15}$ cm$^{-3}$.

Figure 1:
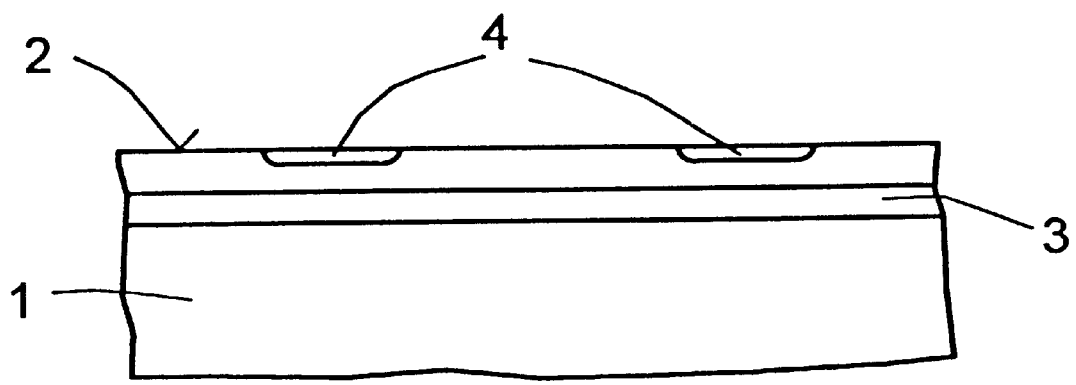
FIG. 1 shows a silicon substrate after a first channel implantation.

Subsequently, implantation with boron is carried out in order to form a channel-stop layer 3. The boron implantation is carried out using a dose of, for example, $6 \times 10^{13}$ cm$^{-2}$ and energy equivalent to for example 120 keV. As a result, the channel-stop layer 3 is produced at a depth of, for example, 0.3 μm below the main surface 2 to a thickness of 0.3 μm (see FIG. 1).

Areas for depletion channels of MOS transistors are then defined using a photolithographic process. The depletion channels 4 are formed using a first channel implantation with arsenic with energy equivalent to 50 keV and a dose of $4 \times 10^{12}$ cm$^{-2}$. The extent of the depletion channels 4 parallel to the main surface 2 is for example 0.6 μm×0.6 μm using 0.4 μm technology.

Figure 2:
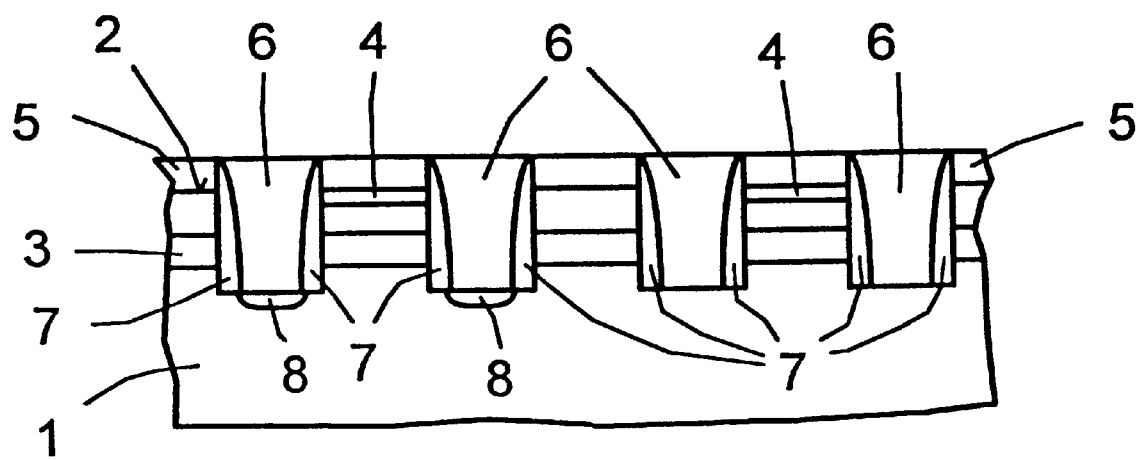
FIG. 2 shows the silicon substrate after etching of a trench and a second channel implantation.

By depositing a layer of SiO$_2$ to a thickness of for example 200 nm using a TEOS process a trench mask 5 is formed by structuring the layer of SiO$_2$ using photolithographic processes (see FIG. 2).

Longitudinal trenches 6 are etched by anisotropic etching for example with Cl$_2$ using the trench mask 5 as etching mask. The longitudinal trenches 6 have a depth of, for example, 0.6 μm. The longitudinal trenches 6 extend into the substrate 1 and interrupt the channel-stop layer 3. The width of the depletion channels 4 is set during the etching of the longitudinal trenches 6. Therefore, the adjustment of the trench mask 5 relative to the depletion channels 4 is not critical.

The width of the longitudinal trenches 6 with 0.4 μm technology is 0.4 μm and the distance between adjacent longitudinal channels 6 is also 0.4 μm. The length of the longitudinal trenches 6 depends on the size of the memory cell array and is for example 130 μm.

By depositing a further layer of SiO$_2$ using a TEOS process and by subsequent anisotropic etching, spacers 7 made of SiO$_2$ are formed at the sidewalls of the longitudinal trenches 6. Areas for the depletion channels for MOS transistors which are subsequently manufactured at the bottom of the longitudinal trenches 6 are then defined using a photolithographic process. The depletion channels 8 are produced at the bottom of the longitudinal trenches with a second channel implantation with for example arsenic and energy equivalent to for example 50 keV and a dose of for example $4 \times 10^{12}$ cm$^{-2}$. The areas between adjacent longitudinal trenches 6 are masked here by the trench mask 5 and the spacers 7. The alignment during the definition of the depletion channels 8 is therefore not critical. The second channel implantation is self-aligned with respect to the sidewalls of the longitudinal trenches 6.

Figure 3:
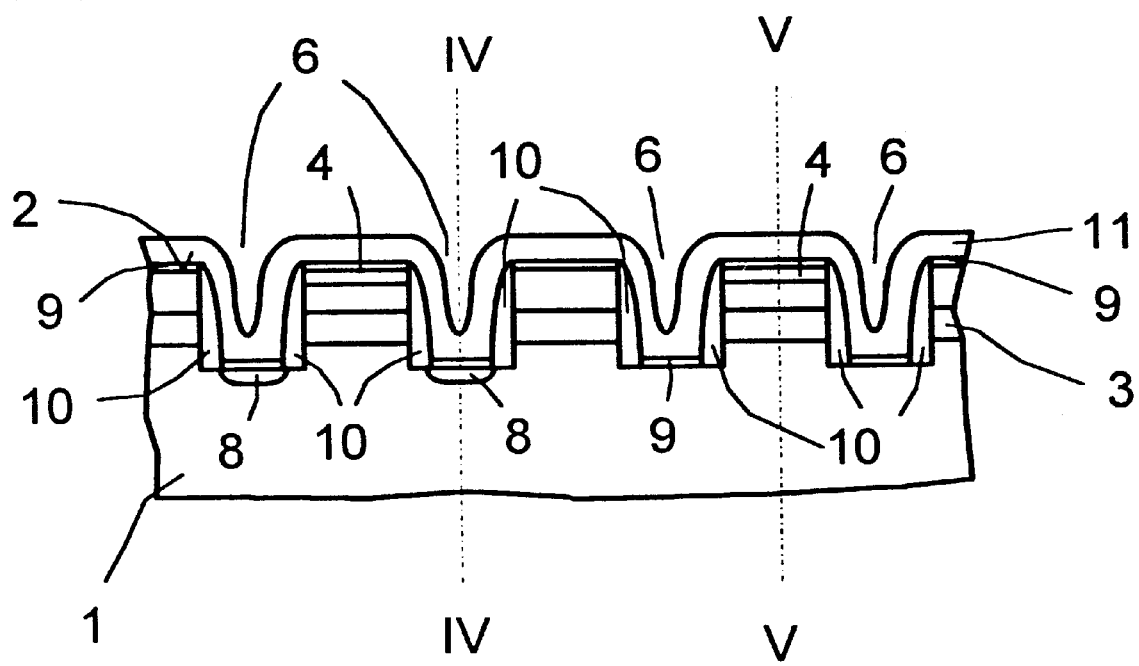
FIG. 3 shows the silicon substrate after the formation of word lines.
Figure 4:
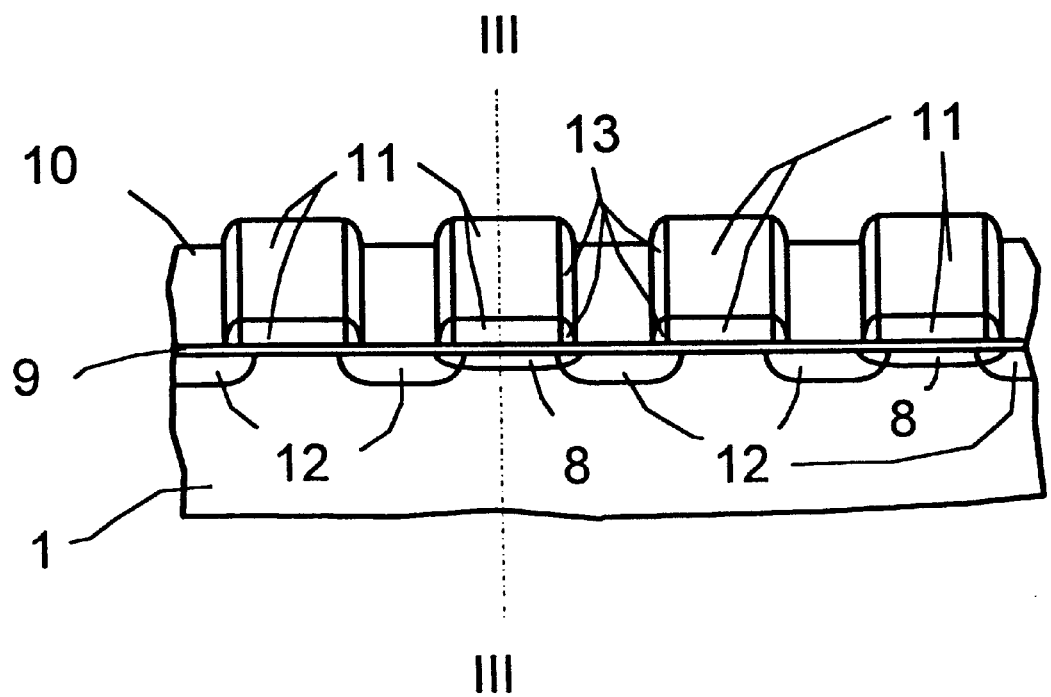
FIG. 4 shows the section, designated in FIG. 3 by IV—IV, through the silicon substrate.
Figure 5:
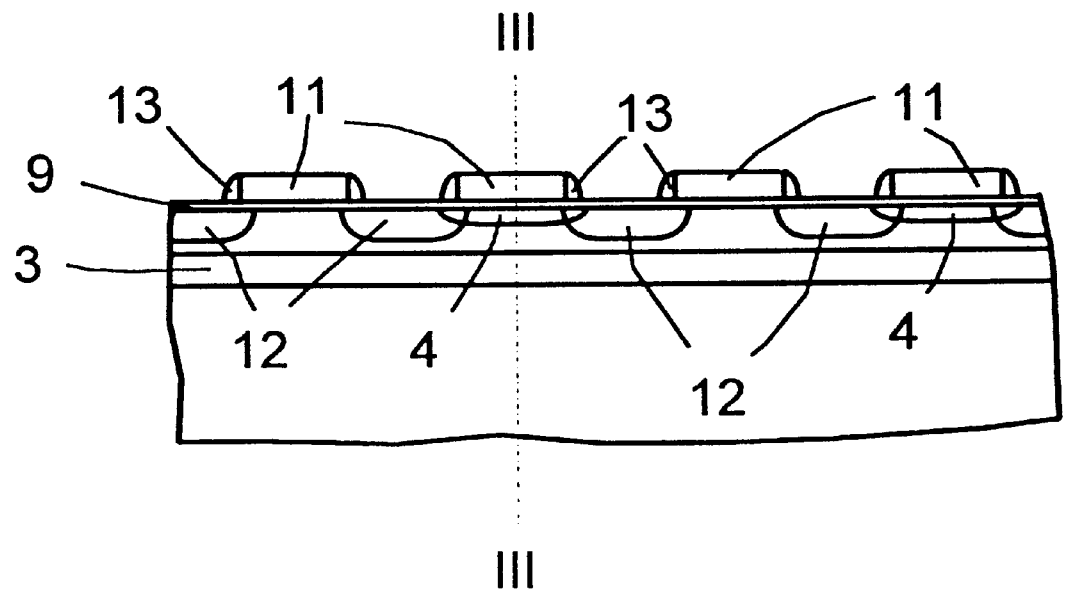
FIG. 5 shows the section, designated in FIG. 3 by V—V, through the silicon substrate.

Subsequently, the trench mask 5 is removed wet-chemically, for example with NH$_4$F/HF. Here, the spacers 7 are also removed. After growing and etching away a sacrificial oxide, a gate oxide layer 9 is grown to a thickness of for example 10 nm. The gate oxide layer 9 is arranged at the base of the longitudinal trenches 6 and between the longitudinal trenches 6 on the main surface 2 (see FIG. 3, FIG. 4 which shows the section, designated by IV—IV, through FIG. 3, and FIG. 5 which shows the section, designated by V—V, in FIG. 3. The section illustrated in FIG. 3 is designated in FIG. 4 and FIG. 5 by III—III in each case).

In a TEOS process a further layer of SiO$_2$ is deposited, from which layer spacers 10 made of SiO$_2$ are in turn formed at the sidewalls of the longitudinal trenches 6 by anisotropic dry etching. The layer of SiO$_2$ is deposited to a thickness of for example 60 nm. The etching back is carried out for example with CF$_4$.

A polysilicon layer is deposited over the whole surface to a thickness of for example 400 nm. By structuring the polysilicon layer in a photolithographic process step word lines 11 are formed which run along the main surface 2, for example perpendicularly to the longitudinal trenches 6. The word lines 11 have a width of 0.4 μm. Adjacent word lines 11 have a spacing of 0.4 μm. The width and spacing of the word lines 11 correspond in each case to a minimum structure size F. The word lines 11 run in such a way that depletion channels 8 formed at the bottom of the longitudinal trenches 6 are each arranged underneath a word line 11.

Subsequently, a source/drain implantation is made for example with arsenic and energy equivalent to for example 25 keV and a dose of for example $5 \times 10^{15}$ cm$^{-2}$. During the source/drain implantation, doped regions 12 are produced at the bottom of the longitudinal trenches 6 and in the main surface 2 between the longitudinal trenches 6. The doped regions 12 each act as a common source/drain region for two adjacent MOS transistors arranged along one row. The word lines 11 are doped simultaneously during the source/drain implantation.

By deposition and anisotropic etching back of a further layer of SiO$_2$ the edges of the word lines 11 are covered with spacers 13. The source/drain implantation takes place in a self-aligned fashion with respect to the word lines 11. Since the doped regions 12 are doped by the same type of conductivity as the depletion channels 4, 8, the alignment during the definition of the depletion channels in the direction parallel to the course of the longitudinal trenches 6 is not critical. The area of the doped regions 12 parallel to the main surface 2 is at maximum F×F, that is to say 0.4 μm×0.4 μm, corresponding to the distance between adjacent word lines 11, the distance between adjacent longitudinal trenches 6 and the dimensions of the longitudinal trenches 6. Every two adjacent doped regions 12 and the word line 11 arranged between them form in each case one MOS transistor. Arranged at the bottom of the longitudinal trenches 6 and between the longitudinal trenches 6 is in each case a row of MOS transistors which are connected in series and are each formed from two doped regions 12 and the word line 11 arranged between them. The MOS transistors arranged at the bottom of a longitudinal trench 6 are insulated by the adjacent MOS transistors, arranged between the longitudinal trenches 6, by means of the spacer 10 and the channel-stop layer 3. The doping of the channel-stop layer 3 of for example $3 \times 10^{18}$ cm$^{-3}$ ensures, together with the spacers 10, that the threshold voltage of the parasitic MOS transistor formed at the edges of the longitudinal trenches 6 is sufficiently high to prevent a leakage current.

Each row is provided at the edge of the read-only memory cell array with two connections between which the MOS transistors which are arranged in the row are connected in series (not illustrated).

Figure 6:
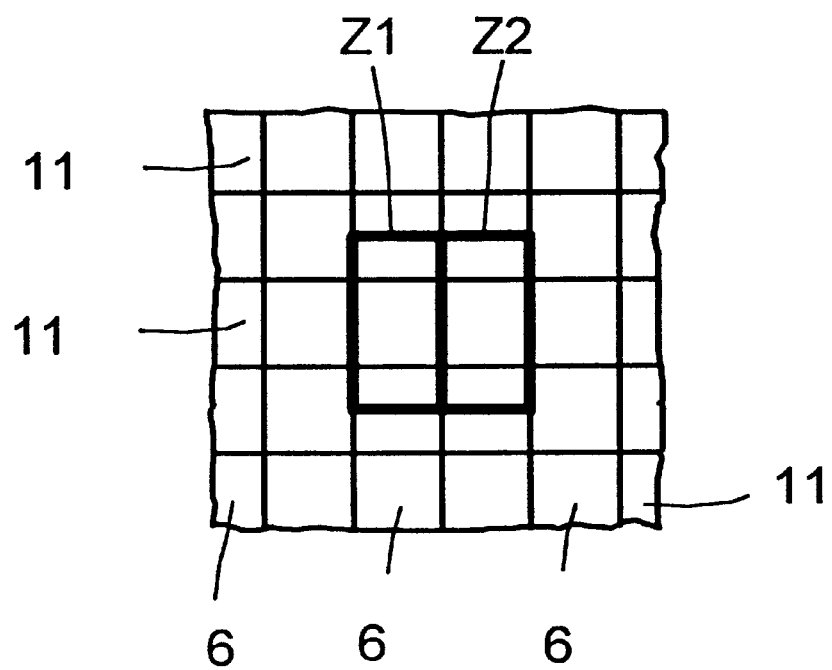
FIG. 6 shows a plan view of the silicon substrate illustrated in FIG. 3.

If one considers that each of the doped regions 12 is a source/drain region for two adjoining MOS transistors, the length of each MOS transistor parallel to the course of the longitudinal trenches 6 is 2F. The width of the MOS transistors is F in each case. For manufacturing reasons the area of a memory cell formed from a MOS transistor is therefore 2 F$^2$. Memory cells which are adjacent along a word line 11 and whose contours Z1, Z2 are entered in the plan view in FIG. 6 as an emboldened line adjoin one another directly in the projection onto the main surface 2. The memory cell Z1 is arranged at the bottom of one of the longitudinal trenches 6 while the memory cell Z2 is arranged on the main surface 2 between two adjacent longitudinal trenches 6. The packing density is increased by the adjacent memory cells which are arranged vertically offset without the insulation between adjacent memory cells being degraded.

The programming of the read-only memory cell array is carried out during the first channel implantation and the second channel implantation. The depletion channels 4, 8 are only formed for those MOS transistors to which a first logic value is assigned. A second logic value is assigned to the other MOS transistors.

The read-only memory cell array is completed by depositing an intermediate oxide, contact hole etchings and applying and structuring a metal layer. These known process steps are not illustrated.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Read-only memory cell array, comprising:
    a plurality of individual memory cells in a semiconductor substrate;
    the memory cells are arranged in rows running essentially parallel;
    longitudinal trenches, which run essentially parallel to the rows, in a main surface of the semiconductor substrate;
    the rows being arranged alternately on the main surface between adjacent longitudinal trenches and at a bottom of the longitudinal trenches respectively;
    insulation structures which insulate adjacent rows with respect to one another;
    each of the memory cells having at least one MOS transistor;
    word lines, each of the word lines being connected to gate electrodes of MOS transistors which are arranged along different rows, the word lines running transversely with respect to the rows.

2. The read-only memory cell array according to claim 1, wherein, for the insulation of adjacent rows, the insulation structures have insulating spacers which are arranged along sidewalls of the longitudinal trenches and doped layers, each of which are arranged between adjacent longitudinal trenches in the semiconductor substrate and prevent formation of conductive channels in the semiconductor substrate between adjacent rows.

3. The read-only memory cell array according to claim 1,
    wherein MOS transistors of memory cells arranged along one row are connected in series;
    wherein source/drain regions, connected to one another, of MOS transistors which are adjacent along one row are constructed as a continuous doped region in the semiconductor substrate;
    wherein each row has two connections, between which connections MOS transistors which are arranged in the row are connected in series.

4. The read-only memory cell array according to claim 1, wherein the MOS transistors have different threshold voltages depending on information stored in a respective memory cell.

5. Read-only memory cell array, comprising:
    a plurality of individual memory cells in a semiconductor substrate;
    the memory cells are arranged in rows running essentially parallel;
    longitudinal trenches, which run essentially parallel to the rows, in a main surface of the semiconductor substrate;
    the rows being arranged alternately on the main surface between adjacent longitudinal trenches and at a bottom of the longitudinal trenches respectively;
    insulation structures which vertically insulate adjacent rows with respect to one another;
    each of the memory cells having at least one MOS transistor;
    word lines, each of the word lines being connected to gate electrodes of MOS transistors which are arranged along different rows, the word lines running transversely with respect to the rows.

6. The read-only memory cell array according to claim 5, wherein, for the insulation of adjacent rows, the insulation structures have insulating spacers which are arranged along sidewalls of the longitudinal trenches and doped layers, each of which are arranged between adjacent longitudinal trenches in the semiconductor substrate and prevent formation of conductive channels in the semiconductor substrate between adjacent rows.

7. The read-only memory cell array according to claim 5,
    wherein MOS transistors of memory cells arranged along one row are connected in series;
    wherein source/drain regions, connected to one another, of MOS transistors which are adjacent along one row are constructed as a continuous doped region in the semiconductor substrate;
    wherein each row has two connections, between which connections MOS transistors which are arranged in the row are connected in series.

8. The read-only memory cell array according to claim 5, wherein the MOS transistors have different threshold voltages depending on information stored in a respective memory cell.

9. Read-only memory cell array, comprising:
    a plurality of individual memory cells in a semiconductor substrate;
    the memory cells are arranged in rows running essentially parallel;
    longitudinal trenches, which run essentially parallel to the rows, in a main surface of the semiconductor substrate;

the rows being arranged alternately on the main surface between adjacent longitudinal trenches and at a bottom of the longitudinal trenches respectively;

insulation structures which insulate adjacent rows with respect to one another;

each of the memory cells having at least one MOS transistor;

word lines, each of the word lines being connected to gate electrodes of MOS transistors which are arranged along different rows, the word lines running transversely with respect to the rows, MOS transistors in a respective row of the different rows being connected inseries.

10. The read-only memory cell array according to claim 9, wherein, for the insulation of adjacent rows, the insulation structures have insulating spacers which are arranged along sidewalls of the longitudinal trenches and doped layers, each of which are arranged between adjacent longitudinal trenches in the semiconductor substrate and prevent formation of conductive channels in the semiconductor substrate between adjacent rows.

11. The read-only memory cell array according to claim 9, wherein MOS transistors of memory cells arranged along one row are connected in series;

wherein source/drain regions, connected to one another, of MOS transistors which are adjacent along one row are constructed as a continuous doped region in the semiconductor substrate;

wherein each row has two connections, between which connections MOS transistors which are arranged in the row are connected in series.

12. The read-only memory cell array according to claim 9, wherein the MOS transistors have different threshold voltages depending on information stored in a respective memory cell.

* * * * *